US006415422B1

(12) United States Patent
Mehrotra et al.

(10) Patent No.: US 6,415,422 B1
(45) Date of Patent: Jul. 2, 2002

(54) METHOD AND SYSTEM FOR PERFORMING CAPACITANCE ESTIMATIONS ON AN INTEGRATED CIRCUIT DESIGN ROUTED BY A GLOBAL ROUTING TOOL

(75) Inventors: Sharad Mehrotra; Parsotam Trikam Patel, both of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/397,762

(22) Filed: Sep. 17, 1999

(51) Int. Cl.[7] ............................................. G06F 17/50
(52) U.S. Cl. ............................................. 716/5; 327/10
(58) Field of Search ............................ 716/7, 18, 1–2, 716/5–6, 8–13

(56) References Cited

U.S. PATENT DOCUMENTS

| | | | | |
|---|---|---|---|---|
| 6,099,580 A | * | 8/2000 | Boyle et al. ............... | 716/7 |
| 6,286,128 B1 | * | 9/2001 | Pileggi et al. ............. | 716/18 |
| 2001/0047507 A1 | * | 11/2001 | Pileggi et al. ............. | 716/8 |

OTHER PUBLICATIONS

Kay, et al., "PRIMO:Probability Interpretation of Moments for Delay Calculation"; Design Automation Conference; pp. 469–472; 1998.*
Togawa, et al., "Maple–opt: A Performance–Oriented Simultaneous Technology Mapping Placement, and Global Routing Algorithm for FPGA's"; IEEE Trans. on CAD of ICs and Systems; 1998.*

* cited by examiner

Primary Examiner—Matthew Smith
Assistant Examiner—Paul Dinh
(74) Attorney, Agent, or Firm—Casimer K. Salys; Bracewell & Patterson, L.L.P.

(57) ABSTRACT

A method for performing capacitance estimations on an integrated circuit design routed by a global routing tool is disclosed. Routing areas and pin locations of a net within an integrated circuit design are initially obtained from a global routing tool. Common boundaries among the routing areas are then defined. Before the performance of a detailed routing step, congestion information furnished by the global routing tool is utilized to perform probabilistic capacitance calculations for an interconnect that can be routed within the routing areas via the defined common boundaries to connect the pin locations.

16 Claims, 6 Drawing Sheets

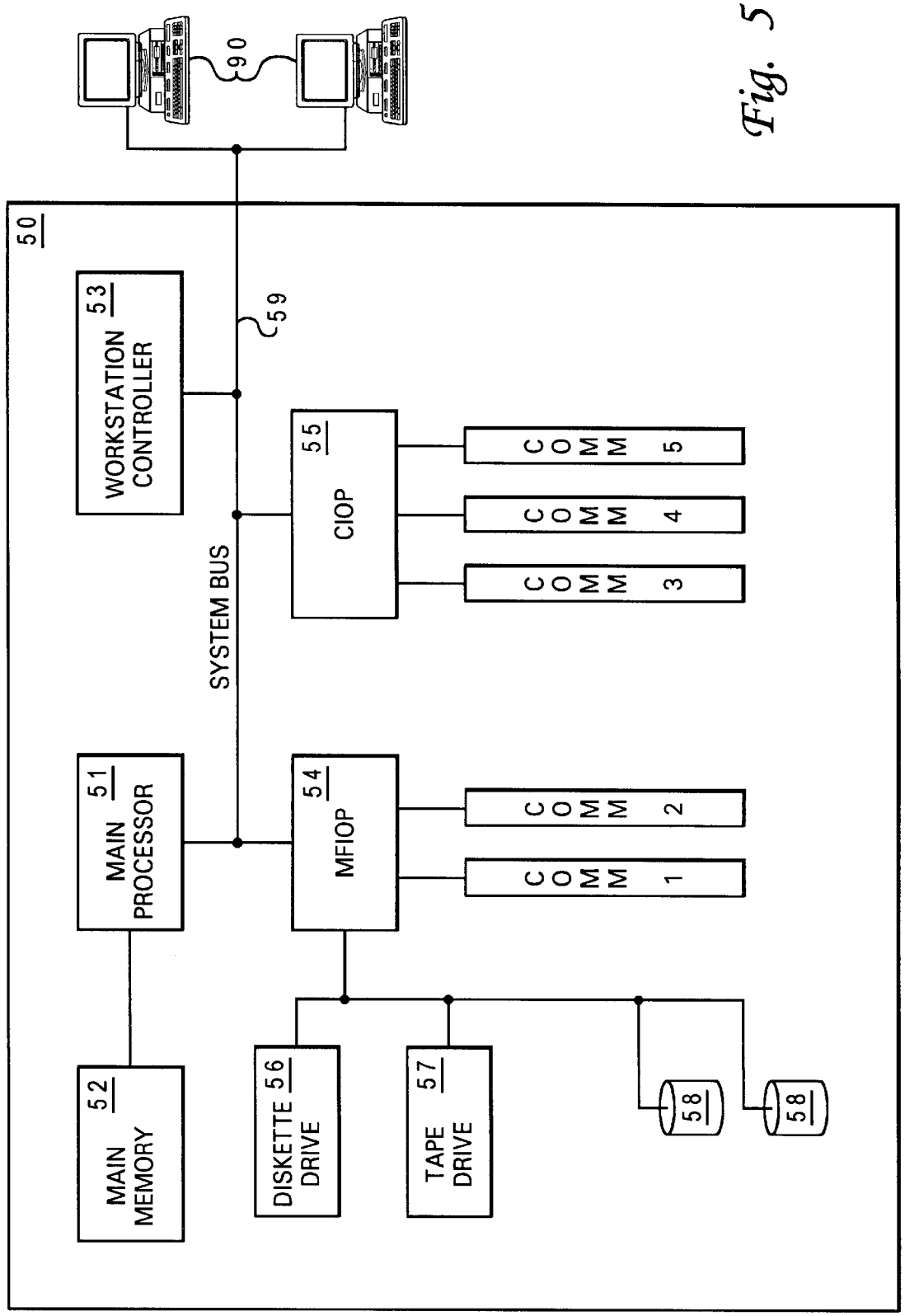

METHOD AND SYSTEM FOR PERFORMING CAPACITANCE ESTIMATIONS ON AN INTEGRATED CIRCUIT DESIGN ROUTED BY A GLOBAL ROUTING TOOL

BACKGROUND OF THE INVENTION

1. Technical Field

The present invention relates to data processing in general and, in particular, to a method and system for performing capacitance estimations on an integrated circuit design. Still more particularly, the present invention relates to a method and system for performing capacitance estimations on an integrated circuit design that is routed utilizing a global routing tool.

2. Description of the Prior Art

A microelectronic integrated circuit (IC) typically comprises a large number of electronic components that are fabricated by layering several different materials on a silicon wafer. Signals are communicated among these electronic components via interconnects. Thus, path delays in an IC are typically dominated by the signal propagation time of interconnects within the IC. In order to properly estimate the signal propagation time of interconnects within an IC during its design, it is crucial to determine the electrical characteristics (including distributed capacitance and resistance) of the interconnects within the IC design. However, the routing of interconnects is typically not completed until the end of the IC design process.

Instead of waiting until the completion of interconnect routing, capacitance estimations for interconnects are conventionally accomplished by constructing a Steiner tree route for a net (ignoring congestion and blockages) and by computing capacitance based on the Steiner tree route. However, there are two primary drawbacks to the conventional method of capacitance estimation. First, the Steiner tree topology is highly inaccurate, and second, a worst-case capacitance computation is typically obtained. As a result, the conventional method of capacitance estimation leads to a more conservative IC design than it is necessary. Consequently, it would be desirable to provide a better method to perform capacitance estimations on an IC design before the detailed routing of interconnects is completed.

SUMMARY OF THE INVENTION

In accordance with a preferred embodiment of the present invention, routing areas and pin locations of a net within an integrated circuit design are obtained from a global routing tool. Common boundaries among the routing areas are then defined. Before the performance of a detailed routing step, congestion information furnished by the global routing tool is utilized to perform probabilistic capacitance calculations for an interconnect that can be routed within the routing areas via the defined common boundaries to connect the pin locations.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 5 is a block diagram of an exemplary computer system in which a preferred embodiment of the invention may be incorporated.

DETAILED DESCRIPTION OF A PREFERRED EMBODIMENT

The physical design process for an integrated circuit (IC) is commonly divided into various distinct stages. These stages include Partitioning, Floor Planning, Placement, Routing, etc. Most, if not all, of the design stages can be partially or fully automated utilizing Computer-Aided Design (CAD) tools.

Figure 1:
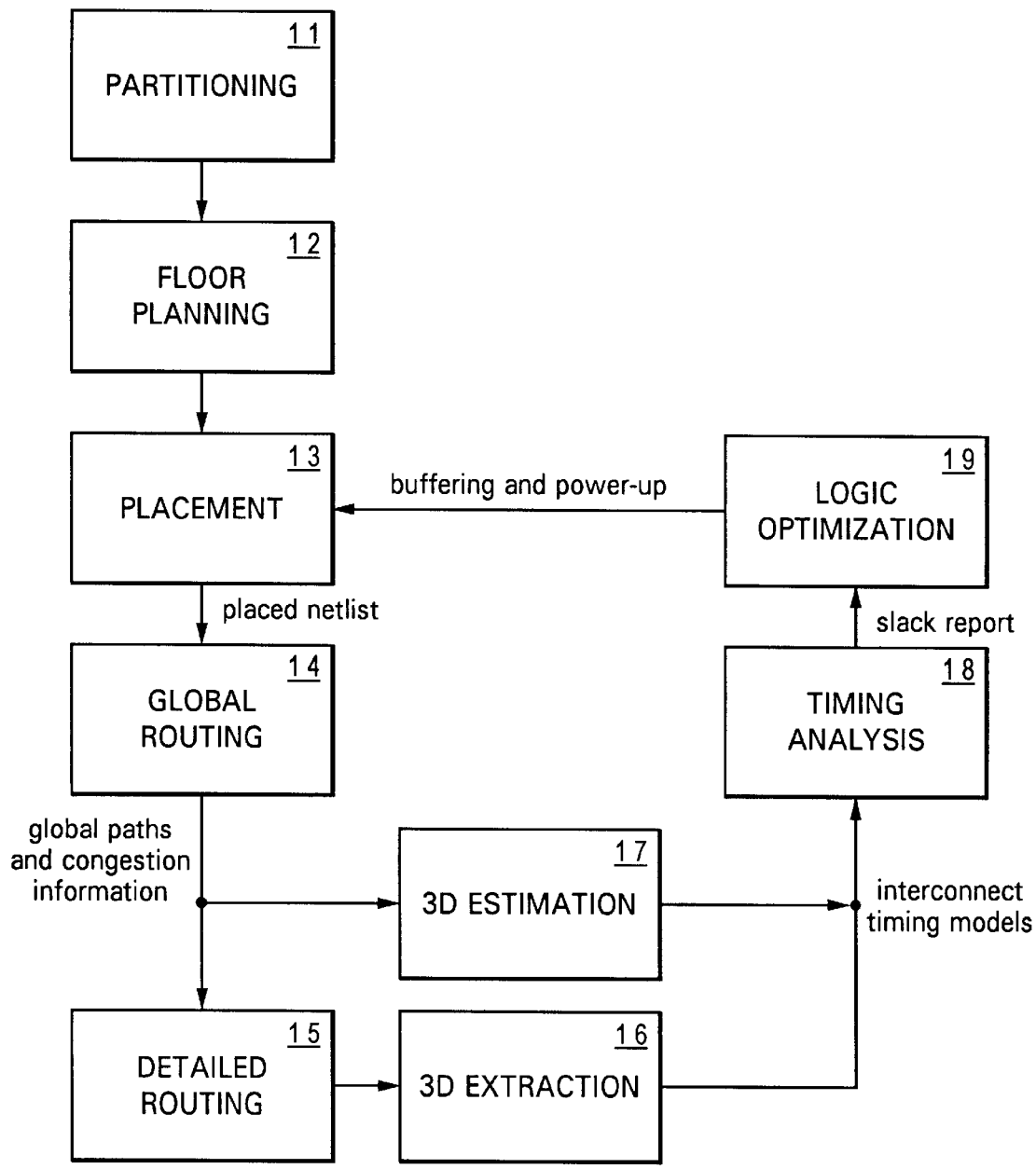
FIG. 1 is a high-level logic flow diagram of various stages in an integrated circuit design process.

Referring now to the drawings and, in particular, to FIG. 1, there is illustrated a high-level logic flow diagram of various stages in an IC design process. An IC design may contain several million transistors, and layout of the entire IC in a single setting is almost impossible due to the limitation of memory space as well as the computation power available. Therefore, the IC design is normally partitioned by grouping all electronic components within the IC design into blocks, such as sub-circuits and modules, during a Partitioning stage, as shown in block 11. The actual Partitioning step considers many factors such as size of blocks, number of blocks, and number of interconnections between blocks. In large IC designs, Partitioning steps are often hierarchical, although non-hierarchical steps can also be utilized. The output of the Partitioning stage is a set of blocks, along with the interconnections required between blocks. The set of interconnections required is commonly referred to as a netlist.

A Floor Planning stage, as depicted in block 12, is concerned with selecting good layout alternatives for each of the blocks within the IC design, as well as between blocks and at the edges. The Floor Planning stage is a critical stage because it establishes the ground work for a good layout of the entire IC.

During a Placement stage, as shown in block 13, the blocks generated from the Floor Planning stage are positioned within the floor plan exactly where they will be fabricated. The goal of the Placement stage is to find a minimum-area arrangement for the blocks that allows completion of interconnections between the blocks. The Placement stage is typically divided in two phases. In the first phase, an initial placement is created. In the second phase, the initial placement is evaluated, and iterative improvements are made, based on the results generated from a Logic Optimization stage, as depicted in block 19, until the layout has minimum area and conforms to design specifications.

During a Routing stage, the interconnections between blocks are completed according to a specified netlist. Initially, any space not occupied by blocks, which is called a routing area, is partitioned into rectangular regions called channels and switch boxes. The goal of Routing is to then complete all circuit connections by utilizing the shortest possible wire length and the channel and switch boxes.

The Routing stage is also divided in two phases, commonly referred to as a global routing phase, as shown in block 14, and a detailed routing phase, as depicted in block 15. In the global routing phase, connections are completed between proper blocks of the IC, disregarding the exact geometric details of each wire (or interconnect) and terminal. A loose route of a wire through different regions of a routing area is specified during the global routing phase. In the detailed routing phase, point-to-point connections between terminals on the blocks are completed. Loose routing is converted into exact routing by specifying the geometric information such as width of wires and their layer assignments. The detailed routing phase includes channel routing and switch box routing.

After detailed routing, a Three-Dimensional (3D) Extraction, as depicted in block 16, can be performed on the routed IC design. Subsequently, a Timing Analysis, as shown in block 18, is performed on the extracted information of the IC design. Furthermore, Logic Optimization is performed on the IC design, based on the results generated from the Timing Analysis. As mentioned previously, the results from Logic Optimization stage 19 is then fed back to Placement stage 13.

When designing an IC, checking tools are a key part of the design tool set, as they allow for IC designers to verify their work. These checking tools have many different functions, such as capacitance calculation and resistance-capacitance (RC delay) estimation. However, it has always been a problem for these checking tools to provide support throughout all the different development stages mentioned above. This is because in the early stages of an IC design, not much is known about the layout. Only as the design progresses, is more known about rough layout, and finally, complete wiring data is available after Detailed Routing stage 15. Nevertheless, IC designers need to perform capacitance estimations in early design stage to ensure that the IC design falls within the design specification. Hence, capacitance estimations have to be performed as early as possible in the design process.

Instead of performing Detailed Routing and 3D Extraction in order to render capacitance estimations as in the prior art, the present invention provides an improved method for performing capacitance estimations immediately after Global Routing.

Figure 2:
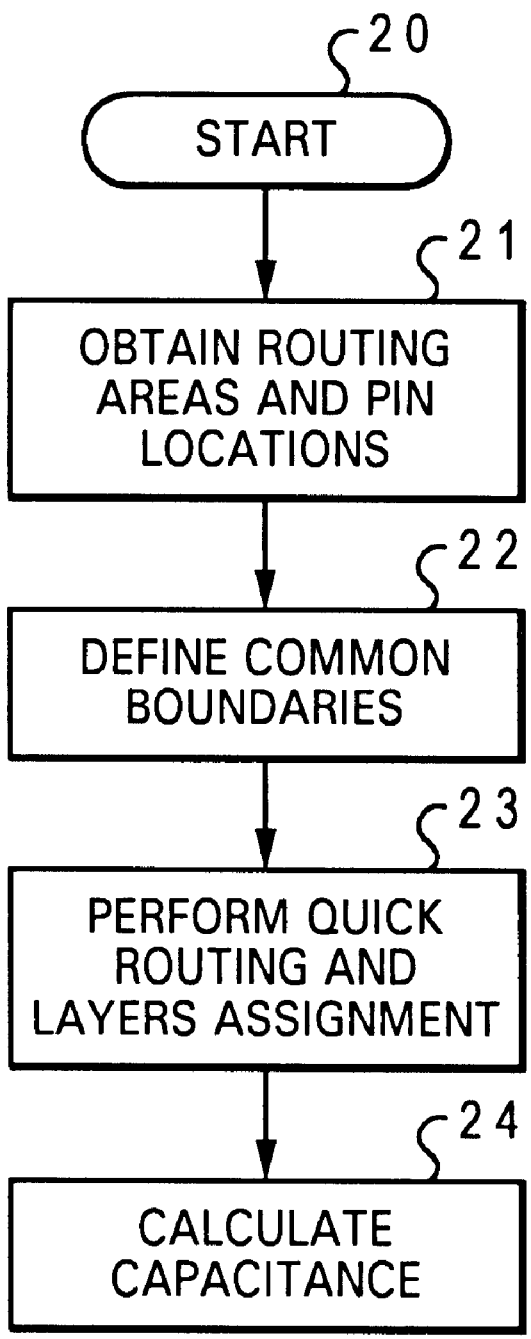
FIG. 2 is a high-level logic flow diagram of a method for performing capacitance estimations on an integrated circuit design that is routed utilizing a global routing tool, in accordance with a preferred embodiment of the present invention.

With reference now to FIG. 2, there is illustrated a high-level logic flow diagram of a method for performing capacitance estimations on an IC design that is routed utilizing a global router, in accordance with a preferred embodiment of the present invention. Starting at block 20, routing areas and pin locations of a net within the IC design are obtained from the global router, as shown in block 21. Next, common boundaries are defined among overlapping routing areas, as depicted in block 22. Then, quick routing and layer assignments are performed to connect pin locations within the defined routing areas via the defined common boundaries, as illustrated in block 23. As a result, pin locations within the defined routing areas of the net are interconnected to each other by an interconnect. Finally, capacitance calculations are performed on the interconnect, as shown in block 24. Such capacitance calculations are probabilistic in nature, as will be further explained infra.

Figure 3A:
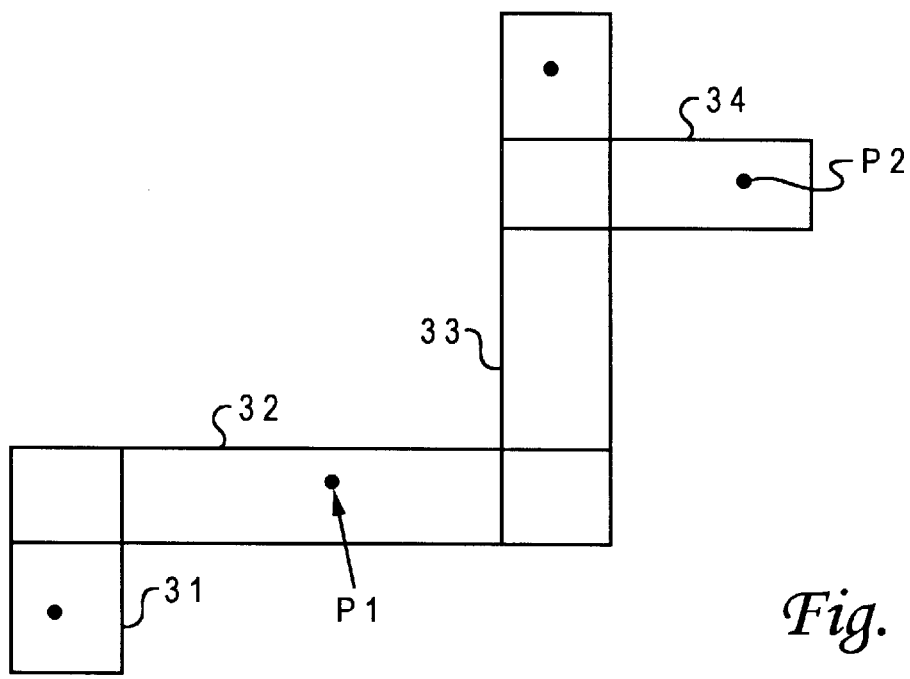
FIGS. 3a–3d are graphical illustrations of an application of steps depicted in FIG. 2 to an integrated circuit; in accordance with a preferred embodiment of the present invention.
Figure 3B:
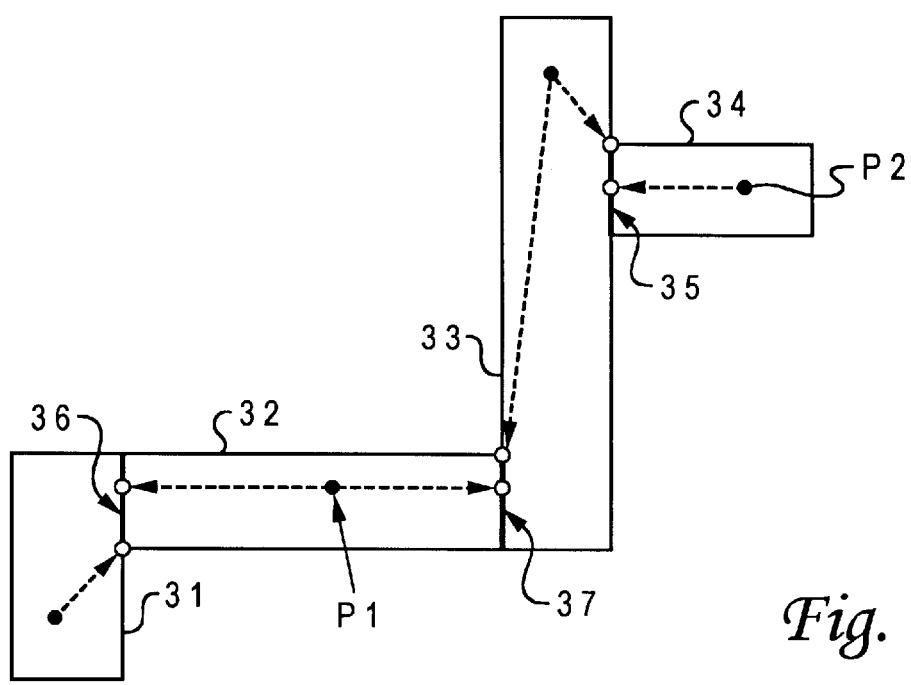

Each of the steps depicted in FIG. 2 can be better understood by referring now to FIGS. 3a–3d. As shown in FIG. 3a, four overlapping routing areas 31–34, for example, are defined within a net. Within each of routing areas 31–34, at least one pin connection is present. For example, pin connection p1 is present within routing area 32, and pin connection p2 is present within routing area 34. Then, some or all of the overlapping regions of routing areas 31–34 are eliminated, as shown in FIG. 3b. As a result, two overlapping routing areas become two adjacent routing areas sharing a common boundary. For example, routing areas 31 and 32 share a common boundary 36, and routing areas 32 and 33 share a common boundary 37. The pin location(s) in each of routing areas 31–34 is then projected to their common boundaries. For example, pin connection p1 is projected to common boundary 36 and common boundary 37, and pin connection p2 is projected to a common boundary 35.

Figure 3C:
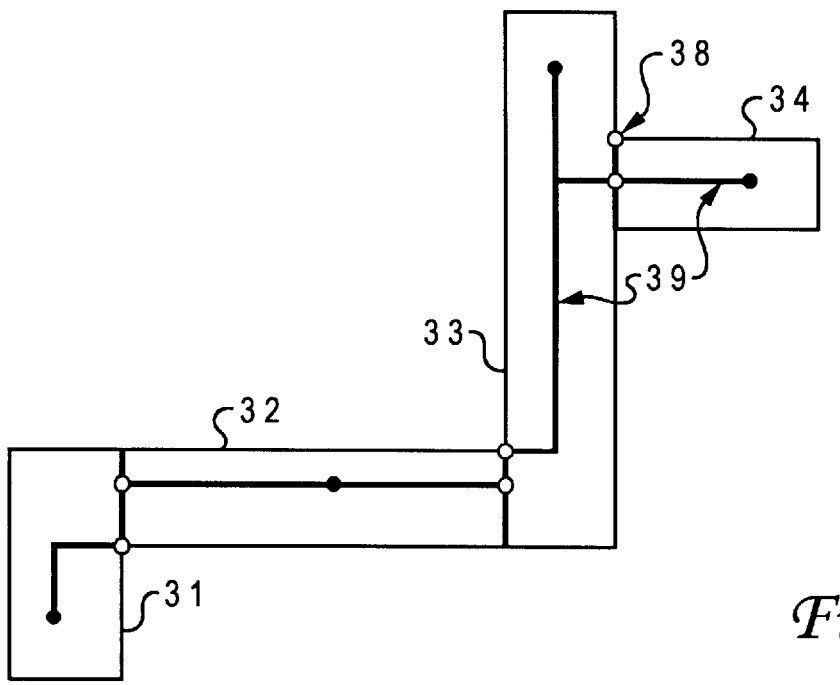
Figure 3D:
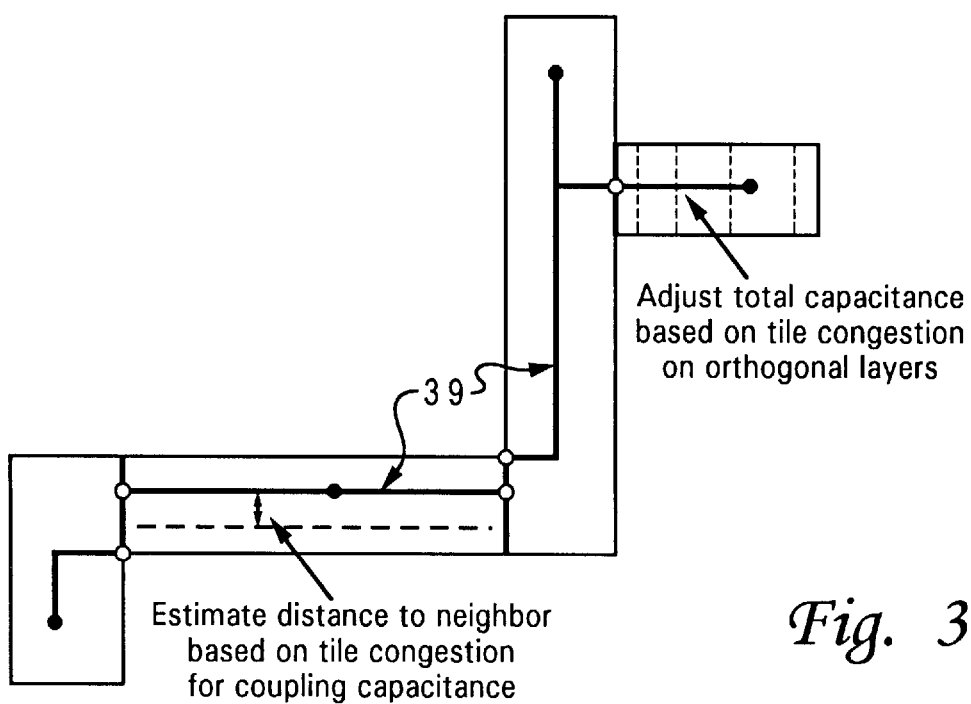

Then, the pin locations from each of routing areas 31–34 are connected to each other via an interconnect 39 constructed by a quick routing process that is well-known in the art, as shown in FIG. 3c. Sometimes, unconnected boundary pins, such as pin location 38, may exist, depending on the routing. In addition, layer assignments for interconnect 39 are also performed at this time. After an approximate route for interconnect 39 is determined, the capacitance of each segment of interconnect 39 is computed, as shown in FIG. 3d. Specifically, an average self-capacitance for interconnect 39 and its split between switching and non-switching capacitance are required to be determined. Although routing and capacitance calculations are shown as separate steps, both steps are considered as an integral step of capacitance estimation.

Figure 4:
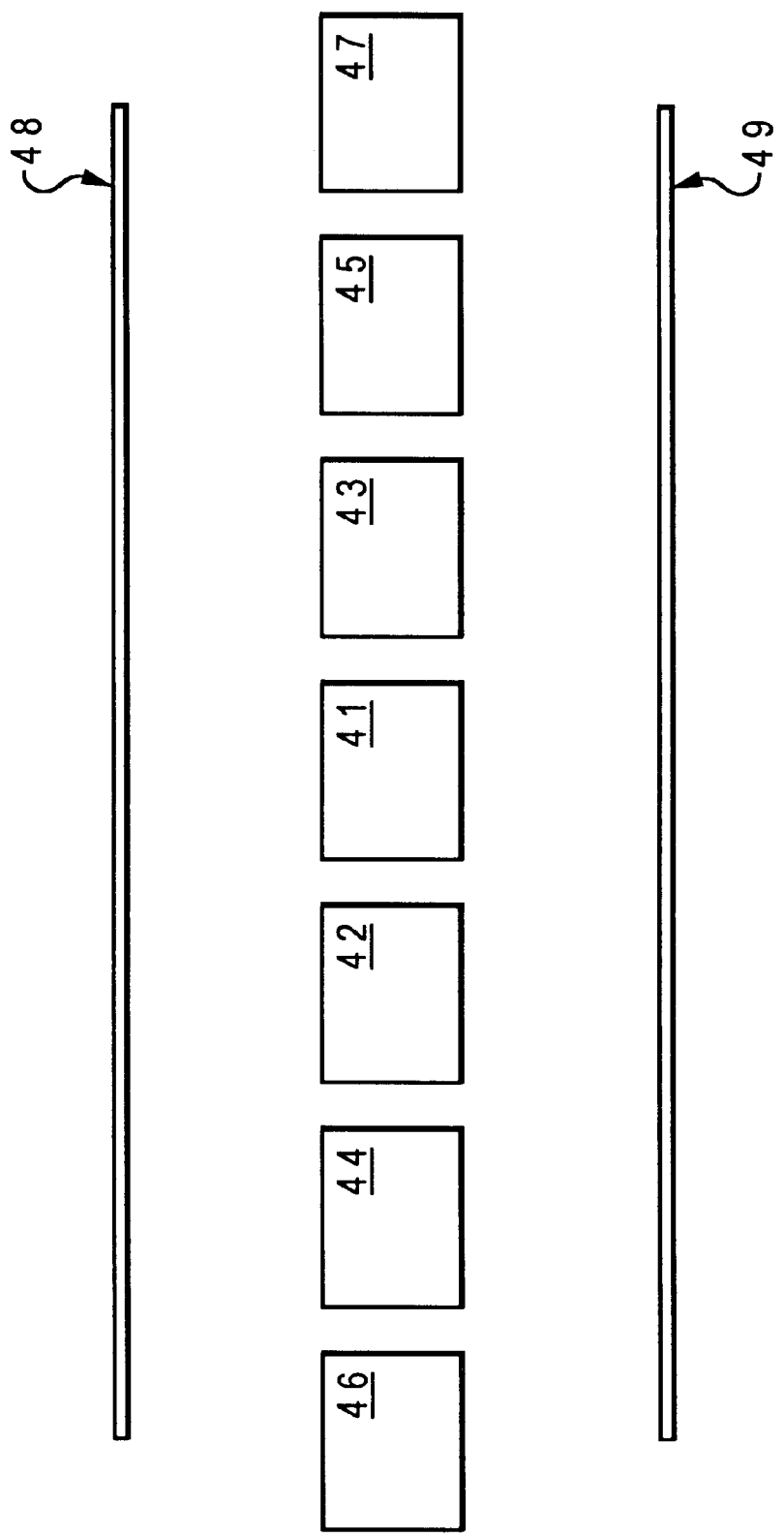
FIG. 4 is a cross-sectional view of an interconnect utilized in a capacitance modelling method, in accordance with a preferred embodiment of the present invention.

With reference now to FIG. 4, there is illustrated a cross-sectional view of an interconnect utilized in a capacitance modelling method in accordance with a preferred embodiment of the present invention. As shown, an interconnect 41 (similar to interconnect 39 from FIG. 3d) is assumed to be flanked by several interconnects, such as interconnects 42–47, on the same level on either side. Interconnect 41 is further assumed to "run" under a plane 48 on the IC layer above and over a plane 49 on the IC layer below.

The distances between interconnect 41 and its adjacent neighbors, such as interconnects 42–47, are preferably estimated based on congestion information obtained from a global router. If a grid-based router will be utilized during the Detailed Routing stage, the distance of an interconnect to its nearest neighbor is assumed to vary in discrete steps. For each step, the probability that another interconnect will be present at the specified number of steps away from the interconnect is computed based on the congestion information available for each tile (each routing area may include more than one tile).

For example, if there are n tracks available in a given tile and m wires need to be routed ($m \leq n$) within the tile, the probability that a track adjacent to any given interconnect on one side is occupied by another interconnect (i.e., interconnect 41 is flanked by interconnects 42, 43) is given by $(m-1)/(n-1)$, which can be called $P_1$. The probability that the next adjacent track is open but the track beyond is occupied (i.e., interconnect 41 is flanked by interconnects 44, 45, but not interconnects 42–43) is given by $(m-1)(n-m)/(n-1)(n-2)$, which can be called $P_2$. The probability that the next occupied track is more than two tracks away (i.e., interconnect 41 is flanked by interconnects 46, 47 but not interconnects 42–45) is the sum of the above two probabilities subtracted from one, which can be called $P_3$. In other words, $$P_1 = \frac{m-1}{n-1}$$

$$P_2 = \frac{(m-1)(n-m)}{(n-1)(n-2)}$$

$$P_3 = 1 - (P_1 + P_2)$$

These probabilities are computed for each tile in each interconnection layer. Given these probabilities, the average capacitance $C_{avg}$ is the weighted sum (using the probabilities as weights) of the self-capacitance, when the adjacent interconnect is one, two, or more than two tracks away, called $C_1$, $C_2$, and $C_3$, respectively, as follows:

$$C_{avg} = C_1 * P_1 + C_2 * P_2 + C_3 * P_3$$

Capacitances $C_1$, $C_2$, and $C_3$ can be pre-computed for a specific processing technology and stored in a look-up table. To compute the capacitance of an interconnect within a net, its intersection with each tile is first determined. The capacitance for each segment of the interconnect lying within a tile is then computed, and these capacitances are aggregated to obtain the total estimated capacitance for the entire interconnect within the net.

It should be noted that these capacitances are computed with an assumption that planes above and below an interconnect (such as planes 48, 49) are fully occupied. Because the global routing congestion information also includes the percentage occupancy of the plane above and below the interconnect, this information can be used to derate the capacitance computed, assuming a full plane by a certain factor. As a preferred embodiment, a congestion-based correction factor is applied as follows: the derating factor is obtained independently for planes 48, 49. For either one of planes 48, 49, the derating factor is a number between 1.0 and some minimum value $s_{min}$. If the plane is fully occupied (i.e., each wiring track is occupied), the derating factor is 1.0. If the plane is minimally occupied (i.e., one track out of the maximum number of wiring tracks $track_{max}$ are used), this derating factor is $s_{min}$. If the plane is less than minimally occupied, the plane is discarded as the bounding plane, and the next plane above (or below) is chosen as the bounding plane. For total capacitance computation, the average capacitance (based on nearest neighbor and fully occupied planes) is multiplied by the derating factor of planes 48, 49. The occupancy $track_{max}$ and factor $s_{min}$ are pre-computed for each interconnecting layer. For occupancy of one track in x (x is less than $track_{max}$), the total capacitance, $C_{total}$ is calculated as follows:

$$C_{total} = C_{avg} * \frac{1}{track_{max} - 1}[(s_{min} - 1) * x + track_{max} - s_{min}]$$

Note that $s_{min}$ and $track_{max}$ refer to the minimum derating factor and minimum occupancy of planes 48, 49, respectively.

As has been described, the present invention provides an improved method for performing capacitance estimations on an IC design that is routed utilizing a global routing tool. The global routing tool divides the IC design into tiles and determines the tile crossed by each net to obtain congestion information for each tile. A quick routing can be performed at this point for each net such that an estimate interconnect path only crosses the tiles specified by the global routing tool. Also, if the global routing tool assigns wiring planes for the net, the estimate interconnect path are routed on those wiring places. In addition, with the congestion information determined by the global routing tool for each tile, the average distance to the nearest neighbor for each interconnect segment can be ascertained. The capacitance of each interconnect segment is computed based on this average distance. Thus, the capacitance estimation for the interconnect is very close to that determined from detailed wiring and extraction performed on the IC design. The increased estimation accuracy removes unnecessary conservatism from the IC design and results in a faster design convergence.

The present invention may be executed in a midrange computer or in a mainframe computer under a number of different operating systems. In addition, the computer may be a stand-alone system or part of a network such as a local-area network (LAN) or a wide-area network (WAN). For the purpose of illustration, a preferred embodiment of the present invention, as described below, is implemented on an RS/6000™ computer, manufactured by International Business Machines Corporation of Armonk, N.Y.

Referring now to FIG. 5, there is illustrated a block diagram of a computer system that may be utilized to implement a preferred embodiment of the invention. Within computer box 50, main processor 51 is coupled to a main memory 52 and a multiple-function I/O processor (MFIOP) 54. Main processor 51 may include a single processor or multiple processors. Several peripheral storage devices such as diskette drive 56, tape drive 57, and direct access storage devices (DASDs) 58, are controlled by MFIOP 54. In addition, MFIOP 54 provides communications to other devices via communication ports such as COMM 1 and COMM 2.

Attached to system bus 59 are a workstation controller 53 and a communications I/O processor (CIOP) 55. Workstation controller 53 provides communications between main processor 51 and workstation(s) 90 that may be connected to the computer system. CIOP 55 provides communications to other devices via communication ports such as COMM3, COMM4, and COMM5.

It is also important to note that, although the present invention has been described in the context of a fully functional computer system, those skilled in the art will appreciate that the mechanisms of the present invention are capable of being distributed as a program product in a variety of forms, and that the present invention applies equally regardless of the particular type of signal-bearing media utilized to actually carry out the distribution. Examples of signal-bearing media include but are not limited to recordable-type media, such as floppy disks or CD ROMs, and transmission-type media such as analogue or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for performing capacitance estimations on an integrated circuit design that is routed by utilizing a global routing tool, said method comprising the steps of:

obtaining routing areas and pin locations of a net within an integrated circuit design from a global routing tool;

defining common boundaries among said routing areas; and before performing detailed routing, performing probabilistic capacitance calculations on an interconnect that can be routed within said routing areas via said common boundaries to connect said pin locations, including a probability that a track adjacent to said interconnect on one side is occupied by another interconnect, wherein said probabilistic capacitance calculations are performed utilizing congestion information furnished by said global routing tool.

2. The method according to claim 1, wherein said probability is calculated by $(m-1)/(n-1)$, where n is a number of tracks available in a given tile and m is a number of wires need to be routed within said tile.

3. The method according to claim 1, wherein said step of performing probabilistic capacitance calculations further includes a step of calculating a probability of said track adjacent to said interconnect is open but a track beyond said track adjacent to said interconnect is occupied.

4. The method according to claim 3, wherein said probability is calculated by $(m-1)(n-m)/(n-1)(n-2)$, where n is a number of tracks available in a given tile and m is a number of wires need to be routed within said tile.

5. The method according to claim 3, wherein said step of performing probabilistic capacitance calculations further includes a step of calculating a probability of a next occupied track is more than two tracks away from said interconnect.

6. The method according to claim 5, wherein said probability is calculated by $1-\{[(m-1)/(n-1)]+[(m-1)(n-m)/(n-1)(n-2)]\}$, where n is a number of tracks available in a given tile and m is a number of wires need to be routed within said tile.

7. A computer program product residing on a computer usable medium for performing capacitance estimations on an integrated circuit design that is routed by utilizing a global routing tool, said computer program product comprising:

program code means for obtaining routing areas and pin locations of a net within an integrated circuit design from a global routing tool;

program code means for defining common boundaries among said routing areas; and program code means for performing probabilistic capacitance calculations on an interconnect that can be routed within said routing areas via said common boundaries to connect said pin locations, before performing detailed routing, including a probability that a track adjacent to said interconnect on one side is occupied by another interconnect, wherein said probabilistic capacitance calculations are performed utilizing congestion information furnished by said global routing tool.

8. The computer program product according to claim 7, wherein said probability is calculated by $(m-1)/(n-1)$, where n is a number of tracks available in a given tile and m is a number of wires need to be routed within said tile.

9. The computer program product according to claim 7, wherein said program code means for performing probabilistic capacitance calculations further includes a program code means for calculating a probability of said track adjacent to said interconnect is open but a track beyond said track adjacent to said interconnect is occupied.

10. The computer program product according to claim 9, wherein said probability is calculated by $(m-1)(n-m)/(n-1)(n-2)$, where n is a number of tracks available in a given tile and m is a number of wires need to be routed within said tile.

11. The computer program product according to claim 9, wherein said program code means for performing probabilistic capacitance calculations further includes a program code means for calculating a probability of a next occupied track is more than two tracks away from said interconnect.

12. The computer program product according to claim 11, wherein said probability is calculated by $1-\{[(m-1)/(n-1)]+[(m-1)(n-m)/(n-1)(n-2)]\}$, where n is a number of tracks available in a given tile and m is a number of wires need to be routed within said tile.

13. A computer system for performing capacitance estimations on an integrated circuit design that is routed by utilizing a global routing tool, said computer system comprising:

means for obtaining routing areas and pin locations of a net within an integrated circuit design from a global routing tool;

means for defining common boundaries among said routing areas; and means for performing probabilistic capacitance calculations on an interconnect that can be routed within said routing areas via said common boundaries to connect said pin locations, before performing detailed routing, including a probability that a track adjacent to said interconnect on one side is occupied by another interconnect, wherein said probabilistic capacitance calculations are performed utilizing congestion information furnished by said global routing tool.

14. The computer system according to claim 13, wherein said probability is calculated by $(m-1)/(n-1)$, where n is a number of tracks available in a given tile and m is a number of wires need to be routed within said tile.

15. The computer system according to claim 13, wherein said means for performing probabilistic capacitance calculations further includes a means for calculating a probability of said track adjacent to said interconnect is open but a track beyond said track adjacent to said interconnect is occupied.

16. The computer system according to claim 15, wherein said means for performing probabilistic capacitance calculations further includes a means for calculating a probability of a next occupied track is more than two tracks away from said interconnect.

* * * * *